(12) United States Patent
Batson

(10) Patent No.: US 6,304,062 B1
(45) Date of Patent: Oct. 16, 2001

(54) SHUNT RESISTANCE DEVICE FOR MONITORING BATTERY STATE OF CHARGE

(75) Inventor: David C. Batson, Winchester, MA (US)

(73) Assignee: PowerSmart, Inc., Needham, MA (US)

( * ) Notice: Subject to any disclaimer, the term of this patent is extended or adjusted under 35 U.S.C. 154(b) by 0 days.

(21) Appl. No.: 09/687,391

(22) Filed: Oct. 13, 2000

Related U.S. Application Data

(60) Provisional application No. 60/161,941, filed on Oct. 28, 1999.

(51) Int. Cl.[7] .................................................... H01M 10/46
(52) U.S. Cl. ............................................ 320/134; 320/136
(58) Field of Search ..................................... 320/122, 127, 320/128, 132, 134, 136, DIG. 19, DIG. 22

(56) References Cited

U.S. PATENT DOCUMENTS 5,179,340  *  1/1993  Rogers .

* cited by examiner

Primary Examiner—Edward H. Tso
(74) Attorney, Agent, or Firm—McDermott, Will & Emery

(57) ABSTRACT

A device for monitoring current flowing through an electrical circuit includes a current shunt plate connected between at least one terminal of the electrical circuit and an electrical load; a circuit board mounted to the current shunt plate at at least two connection points; and a current measuring device mounted on the circuit board, the current measuring device being adapted for measuring a voltage drop between the at least two connection points and determining the current flowing the current flowing through the electrical circuit.

30 Claims, 3 Drawing Sheets

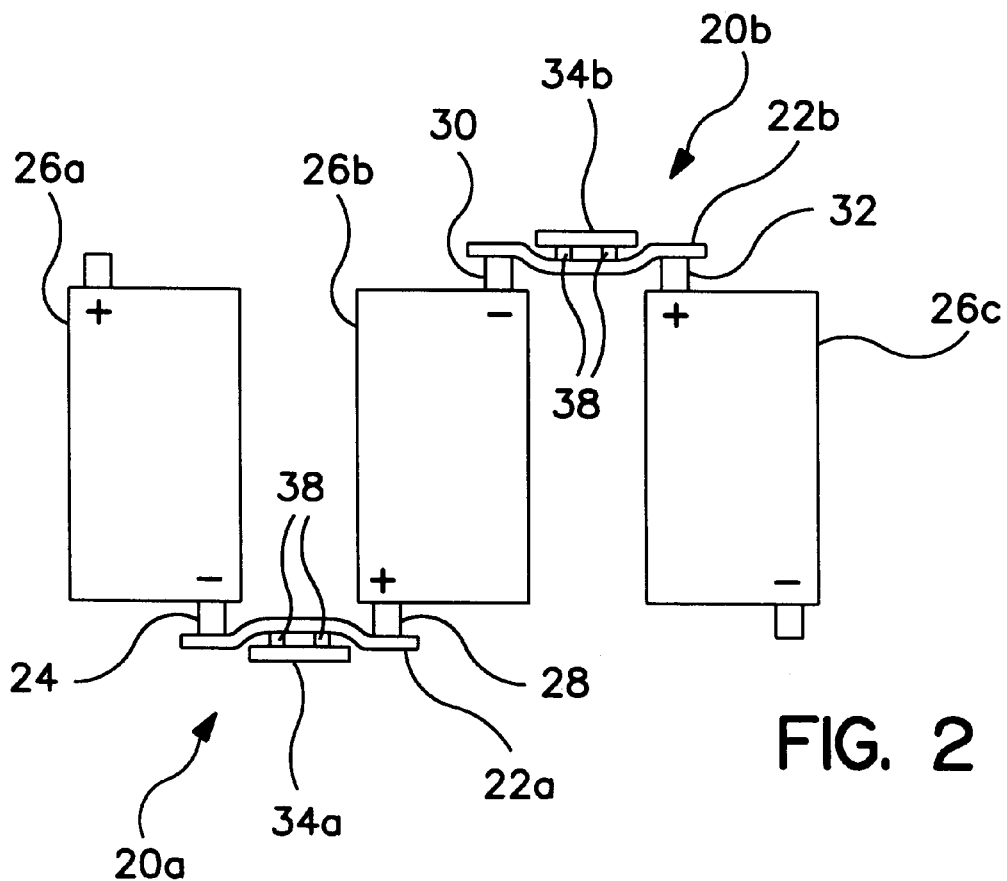
FIG. 2
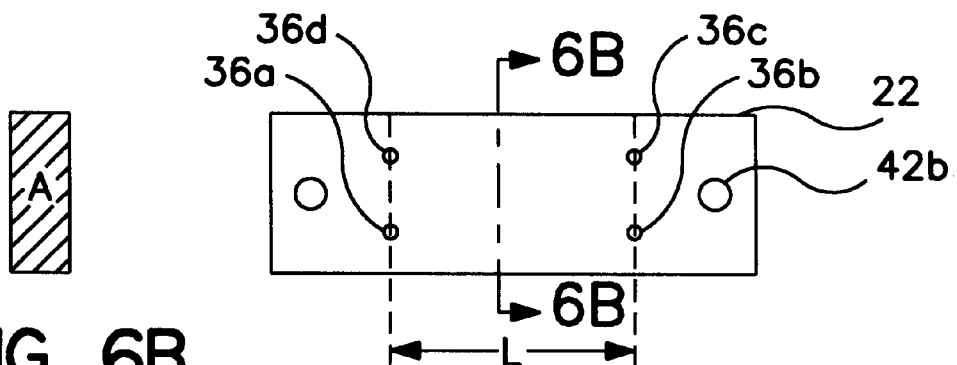
FIG. 6B
FIG. 6A

SHUNT RESISTANCE DEVICE FOR MONITORING BATTERY STATE OF CHARGE

RELATED APPLICATIONS

This application claims priority to U.S. Provisional Application Serial No. 60/161,941, filed Oct. 28, 1999.

FIELD OF THE INVENTION

The present invention relates generally to a shunt resistance device for monitoring the charge and discharge current flowing into or out of an electrochemical energy storage system, such as a battery, and more particularly to a shunt resistance device which minimizes the conductor lengths connecting the voltage sensing points on the shunt resistor to a voltage sensing device thereby reducing the error induced in the measurement due to ambient electromagnetic interference.

BACKGROUND OF THE INVENTION

So-called "smart battery" technology involves a current monitoring unit that monitors the current in a precision resistor connected in series with a battery system and an electrical load to monitor the quantity of electrical charge transferred to or from the battery system. The current monitoring unit measures the charge and discharge current of the battery system and, using an accurate time base, calculates the time integration of charge and discharge current flowing through the battery system. The current time integration can be further enhanced by the use of mathematical models of the charge and discharge efficiencies of the battery system. The unit may also implement a correcting calculation that takes into account the self-discharge rate of the battery system.

The overall accuracy of this approach, which is commonly referred to as "coulomb counting", depends on the accuracy of the current measurement across the fill operating range of the battery system, on both the charging and discharging of the system. Typically, the current measuring device measures the voltage across a shunt resistor connected in series with the battery system and converts the measured voltage to a current, which current is used to determine the state of charge of the battery system. Such a measurement scheme performs adequately in low current systems such as laptop computers, cellular telephones and camcorders where there is little electromagnetic noise in the system which can cause errors in the current measurement. For these small, portable electronic devices the battery power and current are relatively small, in the range of approximately 50W to 100W and 1A to 5A, respectively. The use of smart batteries is widely accepted in these portable systems. The typical smart battery device for these smaller systems employs a small precision shunt resistor, on the order of approximately 10 to 25 mΩ with a 1W rating, mounted directly on a printed circuit board (PCB). This results in a compact and easily assembled device.

For larger battery systems employed in applications such as automotive starting, lighting and ignition (SLI), electric vehicles, hybrid electric vehicles and stationary power backup battery systems, however, the charge and discharge currents are substantially greater in magnitude than for portable electronic devices. For example, SLI batteries may be required to draw as much as 600A during vehicle starting. The larger current levels require substantially lower shunt resistor values and higher power dissipation ratings. The low resistance of such a shunt results in a very small voltage drop across the shunt that must be measured in order to determine the charge and discharge current in the battery system. In some cases, the voltage drop that must be measured can be as low as 10 $\mu V$.

The requirement to dissipate greater amounts of heat prevent the direct mounting of the shunt resistor on a PCB due to both heat dissipation considerations as well as required conductor cross sections to carry these high currents. A current sense resistor is typically mounted remotely from the electronics that measure, convert and/or analyze the shunt resistance voltage drop which is proportional to the current in the shunt resistor. Such an arrangement requires that relatively long conductors or wires be utilized to make the electrical connection between the current sense resistor and the electronic monitoring circuitry. These long conductors or wires cause the low voltage measurements to be subject to induced noise in the presence of a varying electromagnetic field, typically in the form of electromagnetic interference (EMI). The EMI induced in the conductors is proportional to the conductor length as given by the following relationship for the electromotive force (EMF) induced in a stationary conductor exposed to a time varying magnetic field:

$$\oint E \cdot dl = \int_{surface} \frac{\partial B}{\partial t} \cdot ds$$

where E is the electric field intensity, dl is the conductor length and B is the magnetic flux normal to the conductor surface.

Since the function of the battery monitoring system is to provide a time integration of the battery current in order to track the battery state of charge, even small errors in the measurement of the shunt current due to the EMI in the conductors can cause large errors in the state of charge measurement to accumulate over time. These errors render the accurate state of charge monitoring of battery systems in the presence of EMI difficult or impossible with existing current sensor approaches

SUMMARY OF THE INVENTION

What is needed therefore, is a device that minimizes the length of the conductors that connect the shunt resistor to the current monitoring unit, thereby reducing the effect of EMI and enabling the current monitoring unit to obtain accurate current measurements for the determination of the state of charge of the battery system.

The present invention is directed to a shunt for use in monitoring the charge and discharge currents in a battery system of a high current system such as automotive Starting, Lighting and Ignition (SLI) systems, electric vehicles, hybrid electric vehicles and Stationary Backup Power (UPS) systems. A current measurement device in the form of a hybrid circuit on a printed circuit board is mounted directly on the shunt and is electrically connected to the shunt at at least two points. The portion of the shunt between the at least two points forms the shunt resistance, across which the voltage is measured. The current measurement device includes an analog-to-digital converter which measures the current and provides the measurement in a digital format to a microprocessor which computes the state of charge of the associated battery system.

According to one aspect of the invention, a device for monitoring current flowing through an electrical circuit includes a current shunt plate connected between at least one terminal of the electrical circuit and an electrical load; a circuit board mounted to the current shunt plate at at least two connection points; and a current measuring device mounted on the circuit board, the current measuring device being adapted for measuring a voltage drop between the at least two connection points and determining the current flowing the current flowing through the electrical circuit.

A portion of the shunt plate between the at least two connection points forms a shunt resistance R which is related to geometric properties of the current shunt plate. The shunt resistance R may be determined based on the following equation:

$$R=\rho L/A,$$

where $\rho$ is the resistivity of the material of the current shunt plate, L is the length of the shunt resistance between the at least two connection points and A is the cross-sectional area of the shunt plate between the at least two connection points. The circuit board may include an analog-to-digital converter for converting a voltage drop between the at least two connection points to a digital signal and a microprocessor for determining the state of charge of the battery system based on the digital signal. The device may further include current measurement pins for mounting the shunt plate to the circuit board at the at least two connection points. Each of the current measurement pins may include an isolation device for providing isolation between the circuit board and the shunt plate which provides at least one of electrical isolation, thermal isolation and mechanical isolation between the circuit board and the shunt plate. The current shunt plate may be substantially U-shaped and the circuit board may be mounted within a trough of the current shunt plate.

According to another aspect of the invention, a battery system includes a battery having at least two terminals and an electrical load associated with the battery system; a current shunt connected between at least one of the at least two terminals and the electrical load; a circuit board mounted to the current shunt by at least two connection pins; and a current monitoring device mounted on the circuit board for measuring a voltage drop between the at least two connection pins and determining a state of charge of the battery.

The current shunt may include a plate having mounting portions at opposite ends thereof for connecting the plate between the at least one terminal of the battery and the electrical load associated with the battery. A portion of the current shunt plate between the at least two connection pins forms a shunt resistance R which is related to geometric properties of the current shunt plate and is determined based on the following equation:

$$R=\rho L/A,$$

where $\rho$ is the resistivity of the material of the current shunt plate, L is the length of the shunt resistance between the at least two connection pins and A is the cross-sectional area of the shunt plate between the at least two connection pins. The circuit board may include an analog-to-digital converter for converting a voltage drop between the at least two connection pins to a digital signal and a microprocessor for determining the state of charge of the battery system based on the digital signal. Each of the connection pins may include an isolation device for providing at least one of electrical isolation, thermal isolation and mechanical isolation between the circuit board and the current shunt. The current shunt plate may be substantially U-shaped and the circuit board may be mounted within a trough of the current shunt plate. The battery may include a plurality of battery cells connected in series, each of the battery cells having at least two terminals, wherein the current shunt is connected between terminals of any two of the plurality of battery cells within the battery.

BRIEF DESCRIPTION OF THE DRAWINGS

The foregoing and other objects of this invention, the various features thereof, as well as the invention itself may be more fully understood from the following description when read together with the accompanying drawings in which:

FIG. 2 is a diagram showing the current shunt device of the present invention mounted to a battery system;

FIG. 6A is a plan view of the current shunt plate in accordance with the present invention; and FIG. 6B is a cross-sectional view of the current shunt plate in accordance with the present invention, taken along line 6B—6B of FIG. 6A.

DETAILED DESCRIPTION OF THE PREFERRED EMBODIMENTS

Figure 1:
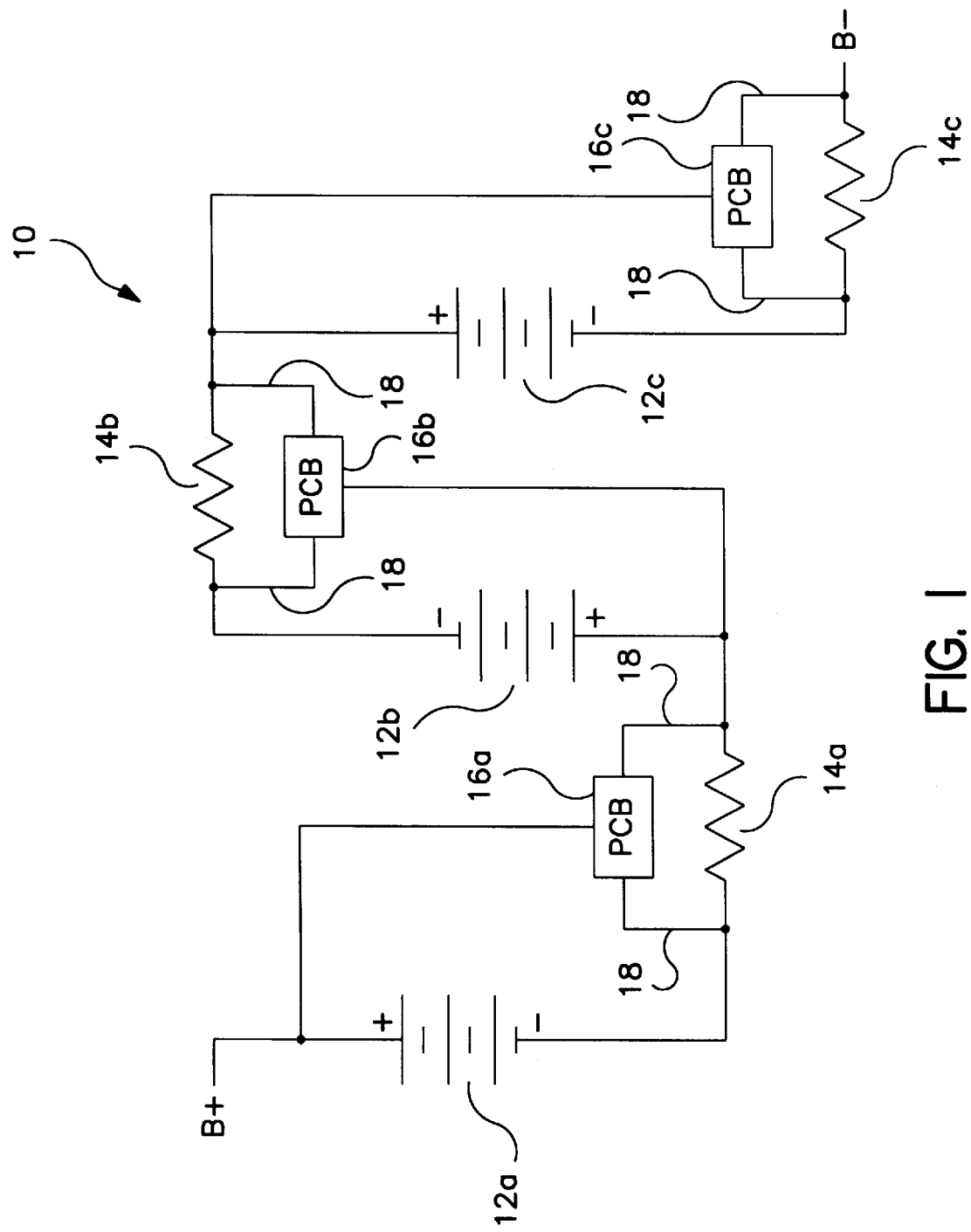
FIG. 1 is a schematic diagram of a conventional state of charge monitoring device.

In order to monitor the state of charge of a "smart" battery system, current shunts are connected in series with the banks of batteries that form the system. As shown in FIG. 1, a battery system 10 includes three battery banks 12a, 12b and 12c which include, for example, eight battery cells each. A first current shunt 14a is connected between the negative terminal of battery bank 12a and the positive terminal of battery bank 12b, a second current shunt 14b is connected between the negative terminal of battery bank 12b and the positive terminal of battery bank 12c and a third current shunt 14b is connected between the negative terminal of battery bank 12c and the negative terminal of the battery system 10. The current shunts 14a–14c are used to measure the charging and discharging current flowing to/from the battery banks 12a–12c. Each current shunt 14a–14c is associated with a printed circuit board 16a–16c, respectively, which include circuitry for measuring the voltage across the shunt and the battery bank terminal voltage and calculating the state of charge of the associated battery bank. Typically, each printed circuit board 16a–16c is connected across the associated current shunt 14a–14c by a pair of conductors 18.

This configuration performs adequately in low power applications such as in laptop computers, cellular telephones and camcorders, because the low power environment does not present a significant amount of electromagnetic noise that can potentially interfere with the precise measurement of the voltage across each shunt. However, in the case of high current applications, such as in automotive Starting, Lighting and Ignition (SLI) applications and Uninterruptable Power Supplies (UPS), the electromagnetic noise present in these high current environments can greatly effect the measurement of the voltage across the shunt, due to the extended length of the conductors 18. Since the resistance of the shunt must be as low as possible in a high current system so as to avoid excessive voltage drop across the shunt and to reduce ohmic heating of the shunt, the voltage that must be measured across the shunt is greatly reduced. Accordingly, in order to accurately measure such low voltages across the shunt, the effects of environmental electromagnetic interference (EMI) must be reduced. In order to reduce the EMI effects on the measurement of the voltage drop across the shunt, the length of the conductors must be reduced.

In order to reduce the effects of EMI associated with high power systems, the present invention includes a shunt plate which is connected, for example, between opposite terminals of a pair of battery banks. The printed circuit board that includes the voltage measuring and state of charge calculating devices is mounted directly on the shunt plate, thereby greatly reducing the length of the conductors that connect the printed circuit board to the current shunt.

The current shunt device of the present invention is shown configured with a battery system in FIG. 2. Current shunt device 20a includes a current shunt plate 22a connected between the negative terminal 24 of battery bank 26a and the positive terminal 28 of battery bank 26b. Current shunt device 20b includes a current shunt plate 22b connected between the negative terminal 30 of battery bank 26b and the positive terminal 32 of battery bank 26c. Each of battery banks 26a–26c may include a single battery cell or a plurality of battery cells connected in series. A circuit board 34a is mounted on current shunt plate 22a by connection pins 38 and a circuit board 34b is mounted on current shunt plate 22b by connection pins 38. The current shunt device 20a, 20b of the present invention is discussed in greater detail below with reference to FIGS. 3–6.

Figure 3:
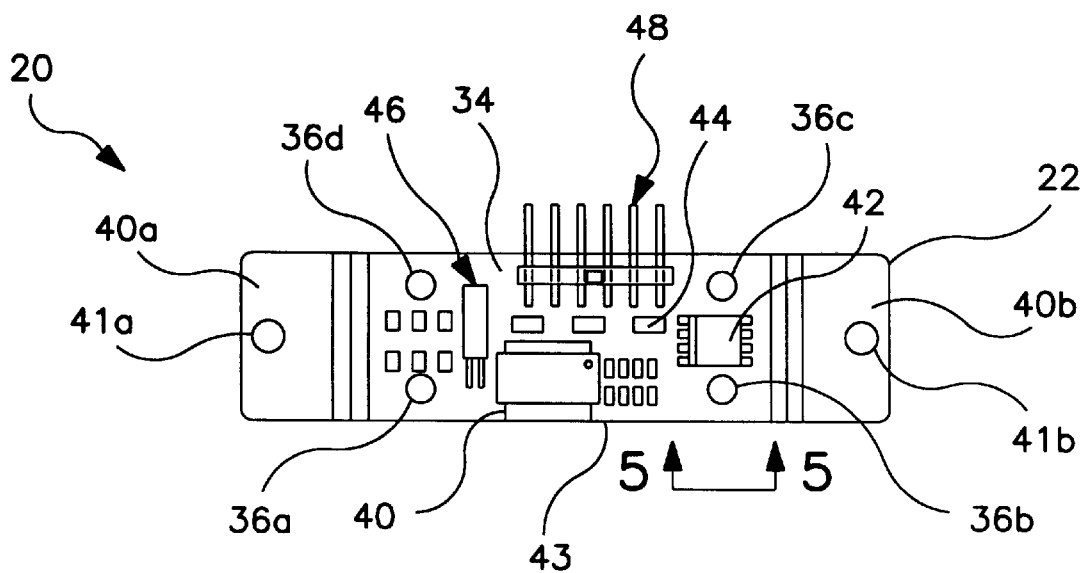
FIG. 3 is a plan view of the current shunt device in accordance with the present invention.
Figure 4:
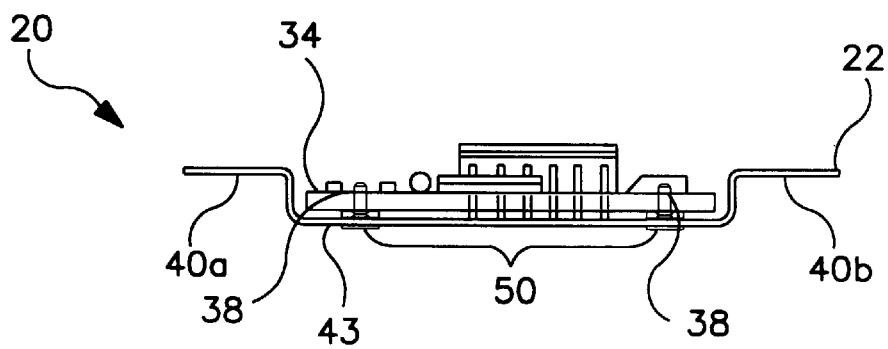
FIG. 4 is a side view of the current shunt device in accordance with the present invention.
Figure 5:
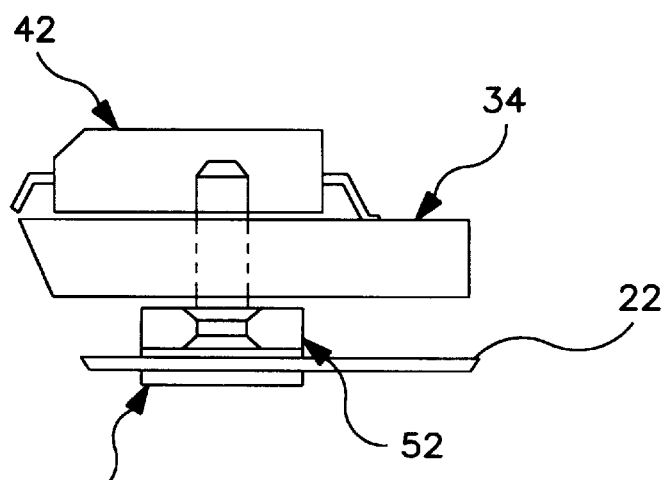
FIG. 5 is a side view of a portion of the current shunt device of the present invention, as seen from line 5—5 of FIG. 3.

FIGS. 3 and 4 are a plan view and a side view of current shunt device 20, respectively. FIG. 5 is a side view of a portion of the current shunt device 20, as seen from line 5—5 in FIG. 3. As shown in the Figs., in a preferred embodiment, current shunt plate 22 is generally U-shaped and includes terminal mounting portions 40a and 40b having terminal mounting apertures 41a and 41b, respectively. Terminal mounting portions 40a and 40b are interconnected by body portion 43 on which circuit board 34 is mounted. Shunt plate 22 is generally U-shaped in order to provide protection for the circuit board by mounting it in the trough of the shunt plate 22. In this configuration, the circuit board 34 and its associated components, described below, are mounted substantially flush with the surfaces of terminal mounting portions 40a and 40b. Greater protection for the circuit board 34 can be obtained by inverting the current shunt device 20 such that the circuit board 34 is shielded by the shunt plate 22. It will be understood, however, that the shunt plate may be substantially flat without affecting the operation of the current shunt device 20.

Circuit board 34 is electrically connected to shunt plate 22 at connection points 36a–36d by current measurement pins 38. The region 50 of body portion 44 between current measurement points 36a and 36b acts as the shunt resistance of the device. Circuit board 34 includes a microprocessor 40 which includes an analog-to-digital converter, a current processing circuit 42, an input current filter device 44, a time reference device 46 and a communication connection device 48. In the preferred embodiment, analog-to-digital converter is a 14 bit converter in which the least significant 13 bits indicate the magnitude of the measured current and the most significant bit indicates the polarity of the measured current. This enables the analog-to-digital converter to have increased resolution which allows it to be very sensitive to any noise in the system. For example, in an application in which the full scale voltage to be measured by the shunt device is ±150mV, the converter will have a resolution of 18.3 $\mu$V per bit. Of course, the resolution of the analog-to-digital converter scales with the magnitude of the full scale voltage that is to be measured.

While the current shunt device shown in FIG. 3 includes four connection points 36a–36d, it will be understood that only two connection points, such as point 36a and 36b, each being at opposite ends of the body portion 44 of shunt plate 22, are required for proper operation of the present invention. An input of the analog-to-digital converter is connected to one of the connection pins 38 at a corresponding connection point 36 at one end of the body portion 44, while another current measurement pin 38 at the opposite end of the body portion 44 is connected to ground. This configuration enables the analog-to-digital converter to receive, at the input thereof, the value of the voltage drop across shunt resistance 50. Connection points 36c and/or 36d and the corresponding current measurement pins 38 can be used to provide separate ground connections to the other elements on the circuit board 34, thereby reducing digital noise at the analog-to-digital converter inputs. Circuit board 34 is electrically, thermally and mechanically isolated from the shunt plate 22 by isolators 52 which are mounted on each current sensing pin 38 between shunt plate 22 and circuit board 34. Isolators 52 can be formed from any material that will electrically, thermally and mechanically isolate the circuit board 34 from the shunt plate 22, such as rubber or any other nonconductive, compliant material.

In order to enable the current processing circuit 42 to properly determine the current present in the shunt resistance of the shunt plate 22, the resistance R of the shunt plate is determined based on the following equation:

$$R=\rho L/A,$$

where $\rho$ is the resistivity of the material of the shunt plate in ohm·cm; L is the length of the resistor between the connection points 36, as shown in FIG. 6A, which is a plan view of the shunt plate 22 with the circuit board 34 removed, and A is the cross-sectional area of the shunt plate, as shown in FIG. 6B.

In operation, the magnitude and polarity of the voltage drop across the shunt resistance is measured between the connection pins 38 by the analog-to-digital converter which converts the analog voltage signal to a 14 bit digital signal which is input to the current processing circuit 42. Input current filter device 44 may be used to filter the analog voltage signal input to the analog-to-digital converter. Current processing circuit 42 determines the current flowing through the shunt resistor based on the digital voltage signal from the analog-to digital converter. Current processing circuit 42 determines the state of charge/discharge of the battery system based on the magnitude and polarity of the current in the shunt resistance and a time base reference signal received from time reference device 46. A state of charge signal is transferred from the current processing circuit to the communication connection device 48 which outputs the state of charge signal to associated circuitry (not shown) that may convert the state of charge signal to a visual representation of the state of charge of the associated battery system.

In an alternative embodiment, the entire current shunt device 20, including the shunt plate 22 and the circuit board 34 is packaged within a housing or epoxy encasement. The encasement provides protection for the elements of the circuit board and allows for simple installation of the current shunt device on a battery system.

Furthermore, although the current shunt device of the present invention is described as being connected between a plurality of batteries in a battery system, it could also be connected between the positive or negative terminals of a single battery and the battery electrical load, for measuring the state of charge of the battery.

Accordingly, the present invention provides a current shunt device that minimizes the length of the conductors that connect the shunt resistor to the current monitoring unit, thereby reducing the effect of radiated electromagnetic noise and enabling the current monitoring unit to obtain accurate current measurements for the determination of the state of charge of a battery system. By mounting the circuit board directly to the current shunt plate, the effect of the electromagnetic noise present in high current systems, such as automotive Starting, Lighting and Ignition systems and Stationary Backup Power systems, is greatly reduced, thereby enabling the current processing circuit 42 to provide a more accurate indication of the state of charge of the associated battery system.

While the invention is described in the context of a battery system for the purpose of monitoring the state of charge of a battery, it will be understood that the shunt resistance device of the present invention may also be used to monitor the current flowing between any type of electrical circuit and an associated electrical load where it is desirable to measure such current flowing therebetween.

The invention may be embodied in other specific forms without departing from the spirit or essential characteristics thereof The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A device for monitoring current flowing through an electrical circuit comprising:
    a current shunt plate connected between at least one terminal of said electrical circuit and an electrical load;
    a circuit board mounted to said current shunt plate at at least two connection points; and
    a current measuring device mounted on said circuit board, said current measuring device being adapted for measuring a voltage drop between said at least two connection points and determining said current flowing through said electrical circuit.

2. The device of claim 1 wherein a portion of said shunt plate between said at least two connection points forms a shunt resistance R.

3. The device of claim 2 wherein said shunt resistance R is related to geometric properties of said current shunt plate.

4. The device of claim 3 wherein said shunt resistance R is determined based on the following equation:

$$R=\rho L/A,$$

wherein $\rho$ is the resistivity of the material of the current shunt plate, L is the length of said shunt resistance between said at least two connection points and A is the cross-sectional area of said shunt plate between said at least two connection points.

5. The device of claim 1 wherein said circuit board includes an analog-to-digital converter for converting a voltage drop between said at least two connection points to a digital signal and a microprocessor for determining the state of charge of said battery system based on said digital signal.

6. The device of claim 2 wherein said circuit board includes an analog-to-digital converter for converting a voltage drop between said at least two connection points to a digital signal and a microprocessor for determining the state of charge of said battery system based on said digital signal.

7. The device of claim 5 further comprising current measurement pins for mounting said shunt plate to said circuit board at said at least two connection points.

8. The device of claim 7 wherein each of said current measurement pins includes an isolation device for providing isolation between said circuit board and said shunt plate.

9. The device of claim 8 wherein said isolation device provides at least one of electrical isolation, thermal isolation and mechanical isolation between said circuit board and said shunt plate.

10. The device of claim 1 wherein said current shunt plate is substantially U-shaped.

11. The device of claim 10 wherein said circuit board is mounted within a trough of said current shunt plate.

12. The device of claim 1 wherein said electrical circuit is a battery system.

13. The device of claim 12 wherein said current measuring device determines a state of charge of said battery system.

14. The device of claim 1, further comprising a housing for containing said current shunt plate, said circuit board and said current measuring device.

15. A battery system comprising:
    a battery having at least two terminals;
    a current shunt connected between at least one of said at least two terminals and an electrical load associated with the battery system;
    a circuit board mounted on said current shunt by at least two connection pins such that said current shunt supports said circuit board; and
    a current monitoring device mounted on said circuit board for measuring a voltage drop between said at least two connection pins and determining a state of charge of said battery.

16. The battery system of claim 15 wherein said current shunt comprises a plate having mounting portions at opposite ends thereof for connecting said plate between said at least one terminal of said battery and the electrical load associated with the battery system.

17. The battery system of claim 16 wherein a portion of said current shunt plate between said at least two connection pins forms a shunt resistance R.

18. The device of claim 17 wherein said shunt resistance R is related to geometric properties of said current shunt plate.

19. The device of claim 18 wherein said shunt resistance R is determined based on the following equation:

$$R=\rho L/A,$$

wherein $\rho$ is the resistivity of the material of the current shunt plate, L is the length of said shunt resistance between said at least two connection pins and A is the cross-sectional area of said shunt plate between said at least two connection pins.

20. The device of claim 15 wherein said circuit board includes an analog-to-digital converter for converting a voltage drop between said at least two connection pins to a digital signal and a microprocessor for determining the state of charge of said battery system based on said digital signal.

21. The device of claim 17 wherein said circuit board includes an analog-to-digital converter for converting a voltage drop between said at least two connection points to a digital signal and a microprocessor for determining the state of charge of said battery system based on said digital signal.

22. The device of claim 15 wherein each of said connection pins includes an isolation device for providing isolation between said circuit board and said current shunt.

23. The device of claim 22 wherein said isolation device provides at least one of electrical isolation, thermal isolation and mechanical isolation between said circuit board and said current shunt.

24. The device of claim 16 wherein said current shunt plate is substantially U-shaped.

25. The device of claim 24 wherein said circuit board is mounted within a trough of said current shunt plate.

26. The device of claim 15 wherein said battery comprises a plurality of battery cells connected in series, each of said battery cells having at least two terminals.

27. The device of claim 26 wherein said current shunt is connected between terminals of any two of said plurality of battery cells within said battery.

28. A battery system comprising:
   a battery having at least two terminals;
   a current shunt connected between at least one of said at least two terminals and an electrical load associated with the battery system;
   a circuit board mounted to said current shunt by at least two connection pins; and
   a current monitoring device mounted on said circuit board for measuring a voltage drop between said at least two connection pins and determining a state of charge of said battery;
   wherein said shunt resistance R is determined based on the following equation:

$$R = \rho L / A,$$

wherein $\rho$ is the resistivity of the material of the current shunt, L is a length of said shunt resistance between said at least two connection pins and A is a cross-sectional area of said current shunt between said at least two connection pins.

29. A battery system comprising:
   a battery having at least two terminals;
   a current shunt connected between at least one of said at least two terminals and an electrical load associated with the battery system;
   a circuit board mounted to said current shunt by at least two connection pins, each of said connection pins including an isolation device for providing isolation between said circuit board and said current shunt; and
   a current monitoring device mounted on said circuit board for measuring a voltage drop between said at least two connection pins and determining a state of charge of said battery.

30. A battery system comprising:
   a battery having at least two terminals;
   a current shunt connected between at least one of said at least two terminals and an electrical load associated with the battery system;
   a circuit board mounted to said current shunt by at least two connection pins; and
   a current monitoring device mounted on said circuit board for measuring a voltage drop between said at least two connection pins and determining a state of charge of said battery;
   wherein said current shunt comprises a substantially U-shaped plate having mounting portions at opposite ends thereof for connecting said plate between said at least one terminal of said battery and the electrical load associated with the battery system.

* * * * *